United States Patent
Fang et al.

(10) Patent No.: US 7,803,680 B2
(45) Date of Patent: Sep. 28, 2010

(54) SELF-ALIGNED PATTERNING METHOD BY USING NON-CONFORMAL FILM AND ETCH BACK FOR FLASH MEMORY AND OTHER SEMICONDUCTOR APPLICATIONS

(75) Inventors: Shenging Fang, Fremont, CA (US);
Kuo-Tung Chang, Saratoga, CA (US);
Tim Thurgate, Sunnyvale, CA (US);
YouSeok Suh, Cupertino, CA (US);
Allison Holbrook, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 292 days.

(21) Appl. No.: 11/653,649

(22) Filed: Jan. 12, 2007

(65) Prior Publication Data

US 2008/0171416 A1    Jul. 17, 2008

(51) Int. Cl.
*H01L 21/336* (2006.01)
(52) U.S. Cl. ............... 438/257; 438/197; 257/314; 257/315
(58) Field of Classification Search ............. 257/314, 257/315, 316, 321, 324, 330; 438/211, 238, 438/259, 270, 197, 257
See application file for complete search history.

(56) References Cited

U.S. PATENT DOCUMENTS

| | | | |
|---|---|---|---|
| 4,870,470 A * | 9/1989 | Bass et al. | 257/324 |
| 6,159,801 A | 12/2000 | Hsieh et al. | |
| 6,355,514 B1 * | 3/2002 | Pham | 438/211 |
| 6,555,427 B1 | 4/2003 | Shimizu et al. | |
| 7,033,957 B1 * | 4/2006 | Shiraiwa et al. | 438/770 |
| 7,067,377 B1 * | 6/2006 | Park et al. | 438/270 |
| 2006/0202263 A1 * | 9/2006 | Lee | 257/330 |
| 2007/0001211 A1 | 1/2007 | Lee | |
| 2007/0243692 A1 * | 10/2007 | Rudeck et al. | 438/400 |

* cited by examiner

*Primary Examiner*—Thanh V Pham
*Assistant Examiner*—Marvin Payen

(57) ABSTRACT

A method for fabricating a memory device with a self-aligned trap layer which is optimized for scaling is disclosed. In the present invention, a non-conformal oxide is deposited over the charge trapping layer to form a thick oxide on top of the core source/drain region and a pinch off and a void at the top of the STI trench. An etch is performed on the pinch-off oxide and the thin oxide on the trapping layer on the STI oxide. The trapping layer is then partially etched between the core cells. A dip-off of the oxide on the trapping layer is performed. And a top oxide is formed. The top oxide converts the remaining trap layer to oxide and thus isolate the trap layer.

15 Claims, 10 Drawing Sheets

SELF-ALIGNED PATTERNING METHOD BY USING NON-CONFORMAL FILM AND ETCH BACK FOR FLASH MEMORY AND OTHER SEMICONDUCTOR APPLICATIONS

FIELD OF THE INVENTION

The present invention relates, in general, to a self-aligned process for fabricating semiconductor memory devices by using a non-conformal film and etch back process.

BACKGROUND OF THE INVENTION

Data is digitally stored in semiconductor memory devices. These semiconductor memory devices fall into one of two categories. Volatile memory devices retain their data only when they are powered on; whereas, non-volatile memory chips can retain the data even if no external power is being supplied to the memory device. One popular form of non-volatile memory device is flash memory. Flash memory is versatile because it can be erased and programmed multiple times. Furthermore, flash memory is relatively inexpensive compared to other types of non-volatile memory devices. Consequently, flash memory is ideal for applications that demand significant amounts of non-volatile, solid-state storage. Examples of applications employing flash memory include USB flash drives, digital audio players, digital cameras and camcorders, mobile phones, automotive control systems, gaming consoles, etc.

Flash memory is typically made up of an array of floating gate transistors, commonly referred to as memory "cells." One or more bits of data are stored as charge by each memory cell. For example, dual bit memory devices use a silicon-oxide-nitride-oxide-silicon (SONOS) type architecture in which a lower layer of silicon oxide is formed over a semiconductor substrate that is typically silicon. A layer of silicon nitride is formed on the lower layer of silicon oxide, an upper layer of silicon oxide is formed on the layer of silicon nitride and a layer of an electrically conductive material is formed on the upper layer of silicon oxide. The combination of the lower silicon oxide layer, the silicon nitride layer, and the upper silicon oxide layer are capable of trapping charge and are commonly referred to as a charge trapping dielectric structure or layer. It should be noted that the charge trapping structure is defined as a stack of ONO. When more than one bit of information is stored in the charge trapping structure, the memory device is referred to as a dual bit memory device. Bit lines are typically formed in the portion of the semiconductor substrate that is below the charge trapping structure and word lines may be formed from the layer of electrically conductive material that is disposed on the charge trapping structure. This arrangement enables flash memory cells to be manufactured efficiently and economically.

Various semiconductor fabrication processes use masks to help align the memory cells. Aligning the cells produces a more organized and compact design. Although masking techniques properly align the cells, scaling becomes an issue. It becomes harder to place the cells closer together. It is important to place the cells as close together without impacting their functionality because denser cells can hold more data for a given semiconductor area. In other words, tighter tolerances allow for greater memory capacity at reduced cost.

A self-aligned process has been developed to help alleviate the scaling issues associated with the use of masks. The self-aligned process eliminates the need to use masks for alignment purposes. FIG. 1 shows a cross-sectional view of an exemplary self-aligned memory device. It can be seen that each active region 101-103 is separated on each side by STI trenches 104-107. The trenches are formed through a shallow trench isolation (STI) process. Any number or combination of layers can be deposited or grown over the active regions 101-103. For example, a tunnel oxide layer (optional), ONO (ONO stands for tunnel oxide-nitride-top oxide) stacks 108-110, polysilicon layer(s) 111, etc. can be formed over the active regions 101-103. Notice that the wings formed as part of the ONO stacks 108-110 bend upwards and extend outwards to the STI trenches 104-107. This limits how closely the memory cells can be placed together. In other words, this limits the scalability of memory devices using such a self-aligned fabrication process.

SUMMARY OF THE INVENTION

A method for fabricating a memory device with a self-aligned trap layer which is optimized for scaling is disclosed. In the present invention, a non-conformal oxide is deposited over the charge trapping layer to form a thick oxide on top of the core source/drain region. The upper portion of the non-conformal oxide has a very narrow gap or can touch and form a pinch-off over the STI trench. The non-conformal oxide widens and forms a void towards its lower portions. A dry or wet etch or a combination of dry and wet etch is performed on the non-conformal oxide and the thin oxide on the trapping layer on the STI oxide. The nitride trapping layer is then partially etched between the core cells. A dip-off of the oxide on the trapping layer is performed. And a top oxide is formed which consumes any remaining nitride trap layer between the core cells to isolate them. Consequently, a trapping structure over an active region is separated from adjacent trapping structures at its bottom-most extended edges.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

The following embodiments are described in sufficient detail to enable those skilled in the art to make and use the invention, and it is to be understood that other embodiments would be evident based on the present disclosure and that process or mechanical changes may be made without departing from the scope of the present invention. In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the invention are semi-diagrammatic and not drawn to scale, and particularly, some of the dimensions are for the clarity of presentation and are shown exaggerated in the Figures.

Figure 1:
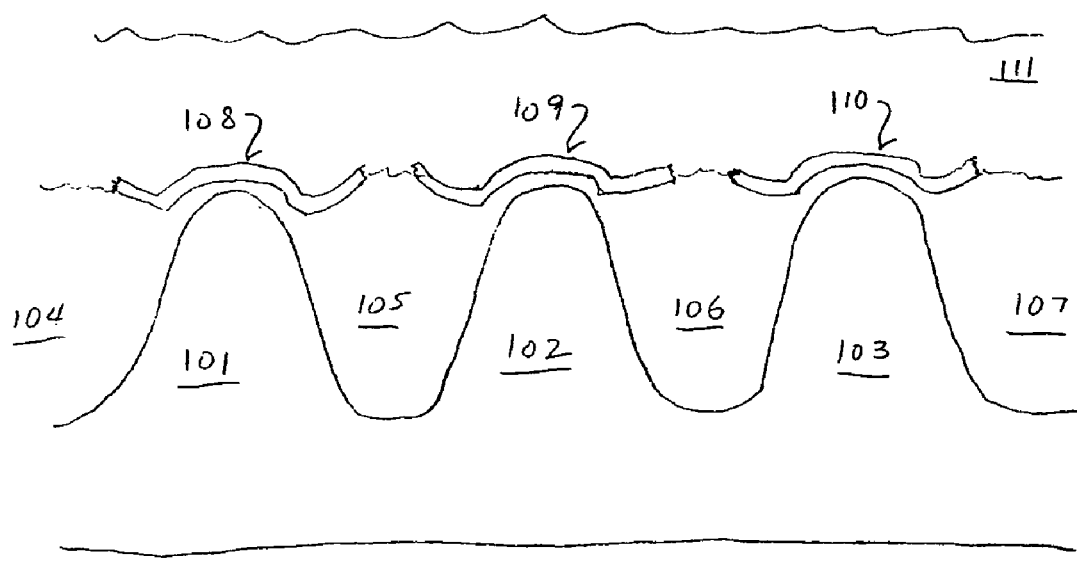
FIG. 1 shows a cross-sectional view of an exemplary self-aligned memory having upwardly extending trapping layers.
Figure 2:
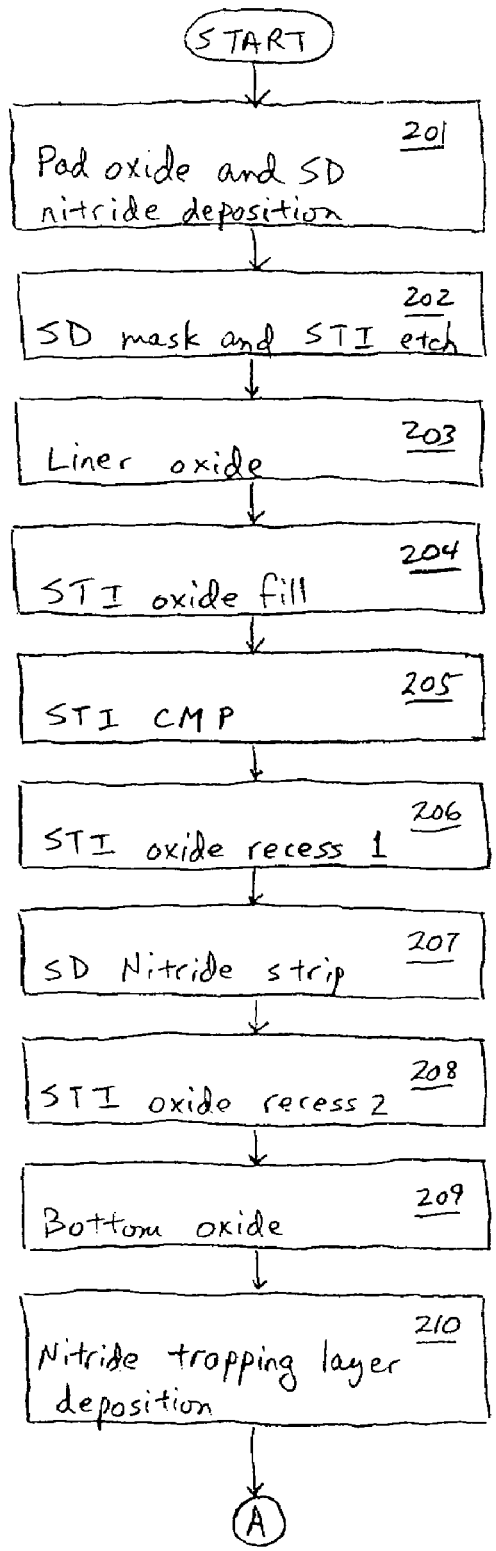
FIG. 2 shows the steps for the initial process flow for fabricating the memory device according to one embodiment of the present invention.

Generally, the present invention provides a method for manufacturing a self-aligned memory device with superior scalability. Semiconductor non-volatile memory devices, such as NOR-type and NAND-type flash memories, can be constructed using oxide/nitride/oxide (ONO) configurations. The nitride layer (e.g., silicon nitride, silicon rich nitride, or multiple layers with different percentages of Si content) closest to the semiconductor substrate in an ONO configuration acts as the charge storing layer and is typically programmed and erased by the tunneling of electrons into and out of this layer. FIG. 2 shows the steps for the initial process flow for fabricating the memory device according to one embodiment of the present invention. In step 201, a pad oxide layer is formed on a silicon substrate. The pad oxide can be grown or deposited over the substrate. A nitride layer for the source/drain (SD) is then deposited. In step 202, a source/drain (SD) mask is patterned, and the core STI etch is performed accordingly. And in step 203, one or more liner oxide layers are formed. It is the combination of one or more liner oxide and/or cleaning processes which causes the corners of the STI to become rounded. It should be noted that other known processes for rounding the corners can be employed at this time. In step 204 an STI oxide fill is performed. The filling can be an insulator material, such as an oxide formed by a high density plasma process. This trench fill material is polished back in step 205 through a chemical mechanical planarization (CMP) technique. Other suitable planarization techniques include electropolishing, electrochemical polishing, chemical polishing, and chemically enhanced planarization. A first STI oxide recess is performed in step 206. The nitride is then stripped in step 207. A second STI oxide recess is performed in step 208. In step 209, a bottom oxide is formed. And in step 210, the nitride trapping layer is deposited.

Figure 3A:
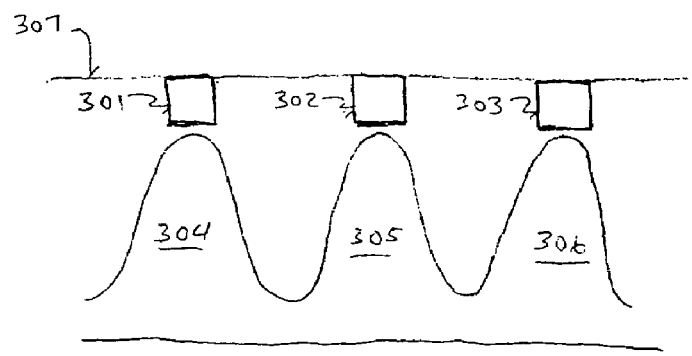
FIG. 3A shows a cross-sectional view of a memory device as it exists upon completing the CMP of the STI.

FIG. 3A shows a cross-sectional view of a memory device as it exists according to the process flow of steps 201-205 described in FIG. 2 above. It can be seen that nitrides 301-303 are over active regions 304-306. The CMP process polishes the top level back to the tops of the nitrides 307.

Figure 3B:
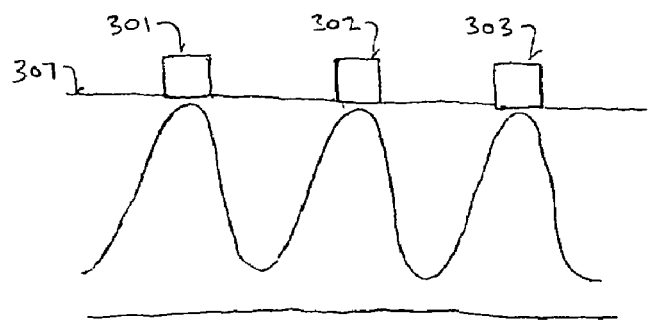
FIG. 3B shows a cross-sectional view of a memory device as it exists upon performing the first STI oxide recess.

FIG. 3B shows a cross-sectional view of a memory device as it exists upon performing the first STI oxide recess of step 206. The oxide is recessed back to the bottom level 307 of the nitrides 301-303.

Figure 3C:
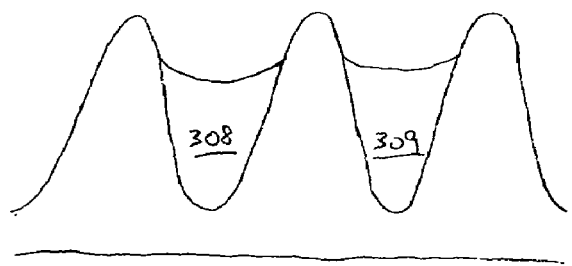
FIG. 3C shows a cross-sectional view of a memory device as it exists upon performing the second STI oxide recess.

FIG. 3C shows a cross-sectional view of a memory device as it exists upon performing the second STI oxide recess of step 208. It can be seen that this produces a bowl-shaped depression in the oxide filled STI trenches 308 and 309.

Figure 4:
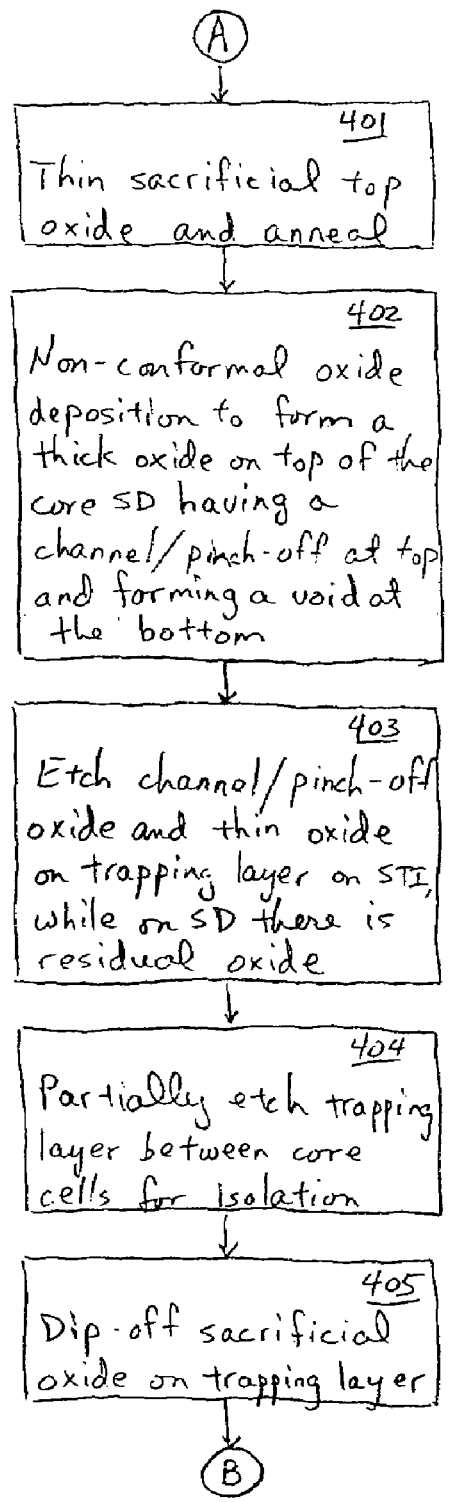
FIG. 4 is a flowchart describing the process flow for isolating the trapping layer between core cells for improved scalability.

FIG. 4 is a flowchart describing the process flow for isolating the trapping layer between core cells for improved scalability. In step 401, a thin conformal sacrificial top oxide is formed through a TEOS process. It should be noted that TEOS is one of the films that can be used for the conformal sacrificial top oxide; other films can be used as well. The high temperature anneal step makes the wet etch rate of the sacrificial oxide slower than the subsequent non-conformal film. A non-conformal oxide is deposited to form a thick oxide on top of the core SD in step 402. This non-conformal oxide can have a narrow channel or can have a pinch-off at the top of the gap in the STI trench. Next, in step 403, a dry or wet etch widens the narrow channel or opens up the pinch-off oxide, and a dry etch of thin oxide on the trapping layer on STI oxide is performed. The SD has a thick residual oxide. The trapping layer between the core cells can now be partially etched in step 404 for isolation. The etching can be either dry or wet or a combination of dry and wet etch. In step 405, a dip-off of the sacrificial oxide on the trapping layer is performed.

Figure 5A:
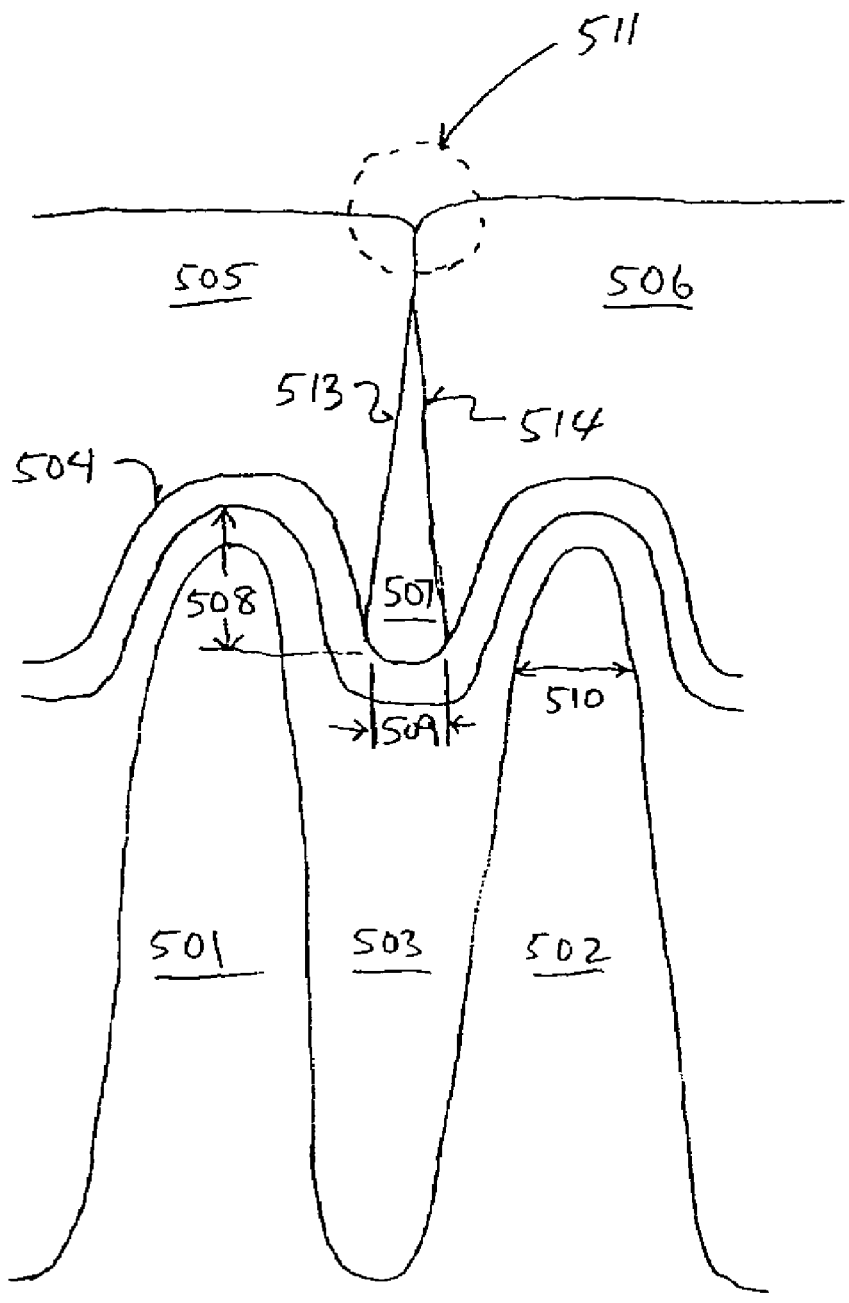
FIG. 5A is a cross-sectional view of the memory device with a non-conformal oxide having a pinch-off region.

FIG. 5A is a cross-sectional view of the memory device with the non-conformal oxide having a pinch-off region. The charge trapping layer 504 is shown over active regions 501-502 and STI trench 503. In one embodiment, the charge trapping layer entails growing a bottom oxide layer. A silicon-rich nitride (SiRN) or multiple layers of nitride with different percentages of Si content are deposited on top of the bottom oxide layer. It should be noted that any charge trapping structure, including but not limited to ONO, can be utilized within the scope of the present invention. Other charge trapping structures can include three or more dielectric layers disposed on the active regions. For example, the top and bottom dielectric layers may be silicon dioxide layers that are oxygen-rich silicon dioxide layers; one or both of which may be thermally grown or deposited oxide layers. Alternatively, one or both of the bottom and top dielectric layers may be silicon dioxide layers that are nitrided oxide layers. The middle dielectric layer may be a silicon-rich silicon nitride layer or a combination of multiple layers with different percentages of Si content. It should be understood that the charge trapping structure is not limited to being a three layer structure or a structure limited to silicon dioxide and silicon nitride. The charge trapping structure may be any dielectric layer or layers capable of trapping charge or that facilitate charge trapping. Other suitable materials include an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric, an oxide/strontium titanate/oxide trilayer dielectric ($SiO_2/SrTiO_3/BaSrTiO_2$), and oxide/hafnium oxide/oxide trilayer dielectric, and the like. A tunnel oxide may be formed between the semiconductor substrate and charge trapping structure.

The non-conformal oxide is depicted as layers 505 and 506. Because the oxide is deposited by means of a non-conformal process, it is thicker in some places and thinner in other places. It is this uneven deposition which results in a void 507. In one embodiment, the tops of the non-conformal oxides meet and touch, forming a pinch-off region shown as 511. As shown, in this embodiment, the sidewalls of the non-conformal oxide are not perfectly vertical. The sidewalls have a slight slope. The sidewall 513 of non-conformal oxide layer 505 has a slight positive slope, and the sidewall 514 of the adjacent non-conformal oxide layer 506 has a negative slope. The sloping sidewalls are due to the non-conformal layers having a base which is narrower than their tops. The slightly sloping sidewalls define the void region 507. For a 22 nm fabrication process, the distance 508 from the peak to the trough of the trapping layer 504 is approximately 20-100 nanometers. The width 509 of the troughs of the trapping layer 504 is approximately 5-50 nanometers. The width 510 of the STI trench measured at the level of the troughs of the trapping layer is approximately 10-30 nanometers.

Figure 5B:
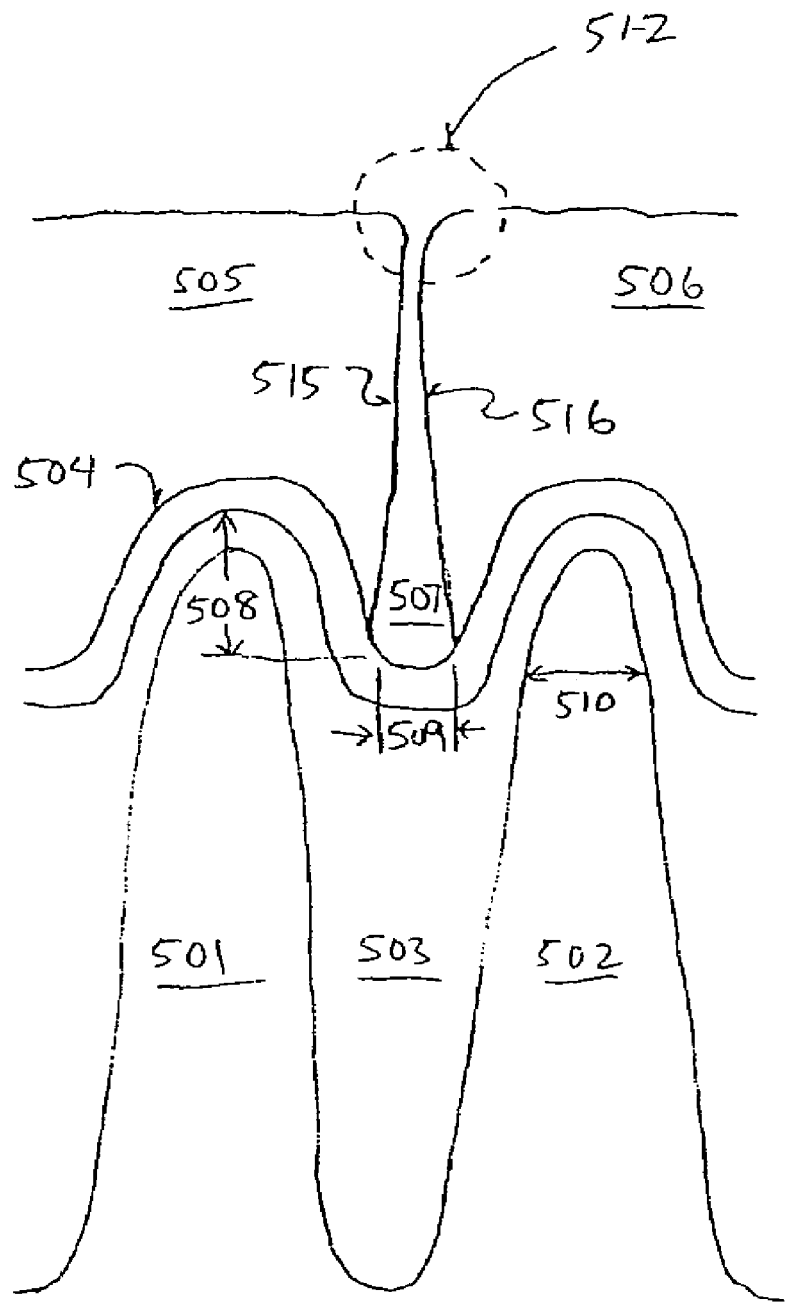
FIG. 5B is a cross-sectional view of the memory device with a non-conformal oxide having a narrow channel region.

FIG. 5B is a cross-sectional view of the memory device with the non-conformal oxide having a narrow channel region. This figure is basically the same as that of FIG. 5A with the exception that the tops of the non-conformal oxides do not touch. There is a narrow gap or channel between the two non-conformal oxides 505 and 506. This narrow channel is depicted by region 512. Again, the sidewalls 515 and 516 of the non-conformal regions 505 and 506 are slightly sloped. Void 507 is bounded on the bottom by the charge trapping layer 504; on either side by sidewalls 515 and 516; and open on the top by channel region 512.

Figure 6:
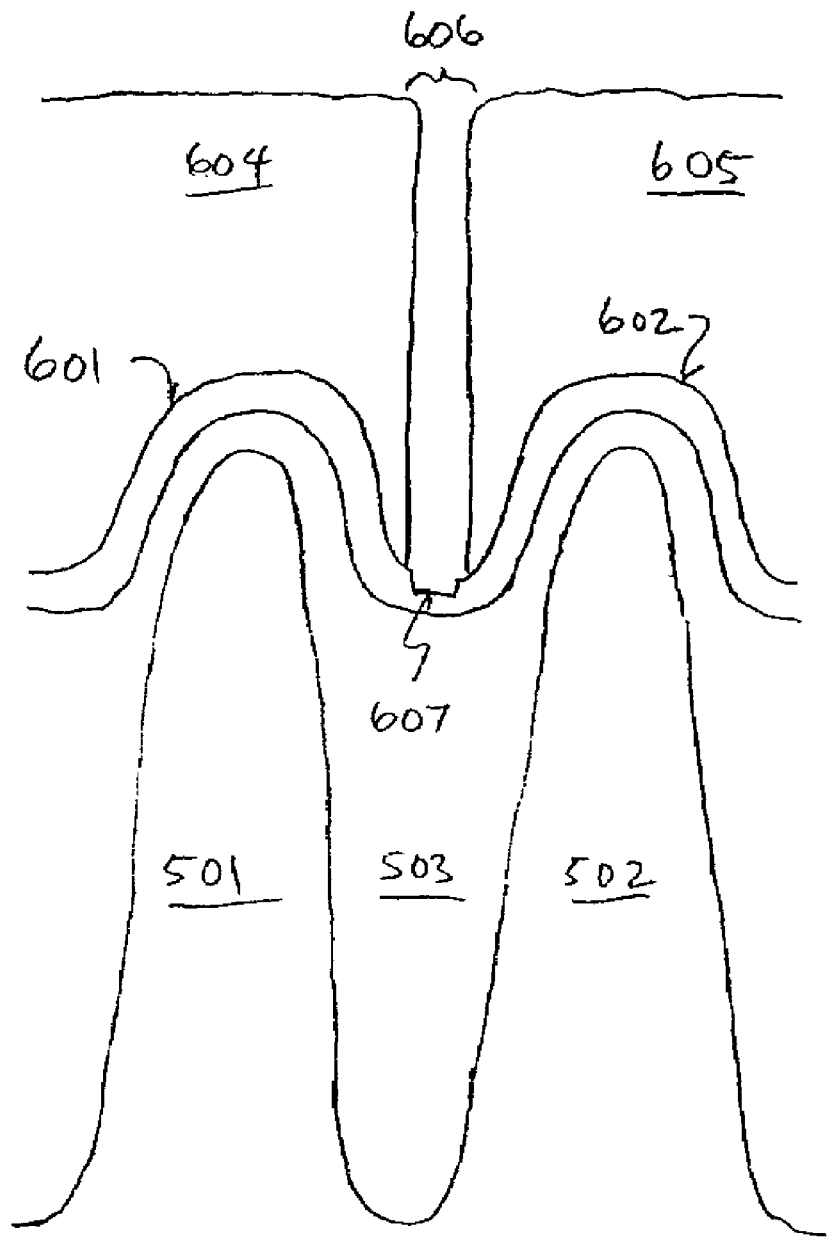
FIG. 6 is a cross-sectional view of the memory device as it exists from dry etch of the pinch-off to partially etch the nitride trap layer.

FIG. 6 is a cross-sectional view of the memory device as it exists according to the process flow described above after performing steps 403-405 of FIG. 4. The wet etch of the non-conformal oxide causes a separation 606 to be formed between the two oxide areas 604 and 605. In the case of a pinch-off situation, the two non-conformal oxides are separated. In the case of a narrow channel situation, the channel is widened. This separation exposes the void (507 of FIG. 5). A wet or dry etch of oxide on top of the trapping layer between 604 and 605 is performed. The trapping layer is partially etched off by a wet or dry etch. The partially etched portion of the trapping layer is depicted as slot 607.

Figure 7:
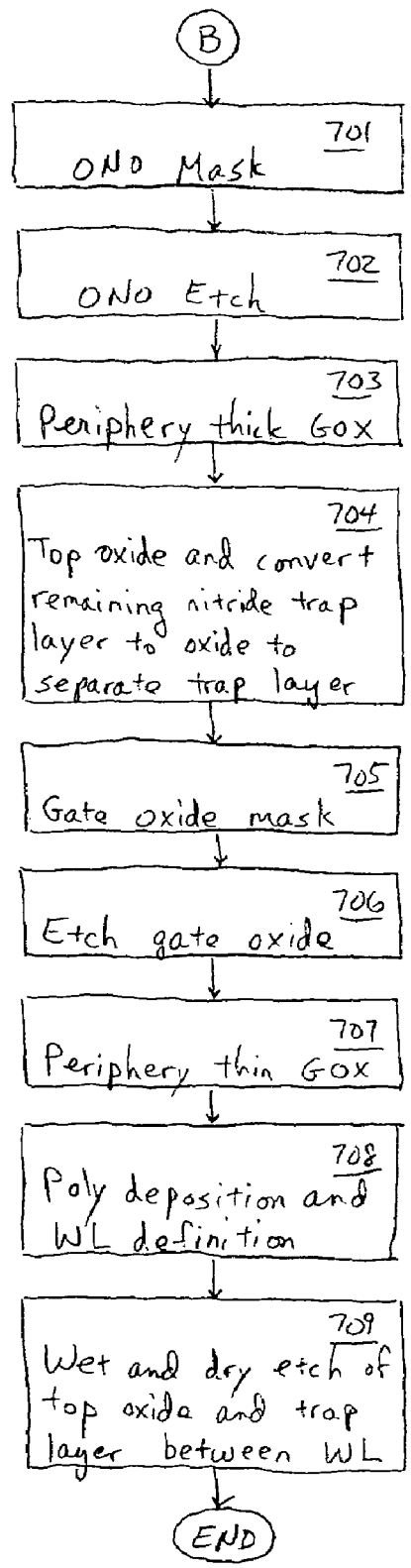
FIG. 7 is a flowchart describing the steps for the process associated with a periphery integration scheme.

FIG. 7 is a flowchart describing the steps for the process associated with a periphery integration scheme. Upon forming the self-aligned ONO stacks, an ONO masking step 701 is performed. The ONO in the periphery area is then etched in step 702. A first periphery gate oxide layer is fabricated in step 703. A low temperature plasma or furnace top oxide is fabricated in step 704. This top oxide also converts the remaining nitride trapping layer to oxide and thus separates the trapping layer for each active region. The gate oxide is then masked in step 705. The gate oxide is then etched in step 706. And a second periphery gate oxide layer is fabricated in step 707. In one embodiment, the second periphery gate oxide layer has a thickness less than that of the first periphery gate oxide layer. A polysilicon layer is deposited and the word line definition is performed in step 708. In step 709, wet and dry etch of the top oxide and trap layer between word lines is performed. Thereafter, the process steps follow well-known, conventional fabrication techniques.

Figure 8:
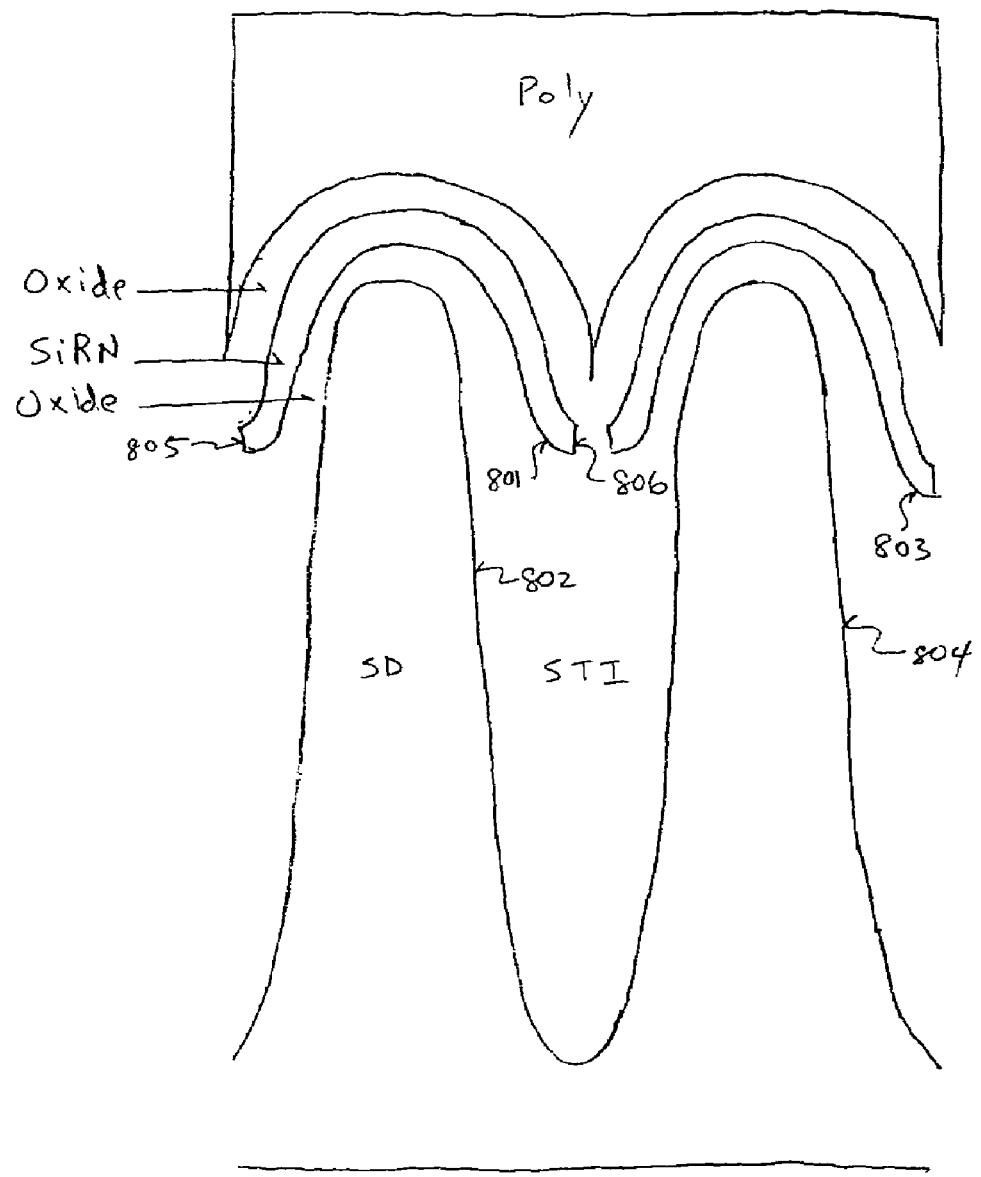
FIG. 8 shows a cross-sectional view of a formalized memory device according to one embodiment of the present invention.

FIG. 8 shows a cross-sectional view of a formalized memory device according to one embodiment of the present invention. Note that the subsequent top oxide oxidizes the remaining nitride trap layer in 607, converting the remaining nitride trap layer to oxide, and thus separates the trapping layer between the two active regions. The result is that the trapping layers are segmented from each other. For example, there is a trapping layer 801 above active region 802 and a separate trapping layer 803 above active region 804. Each active region has its own charge trapping layer. In particular, a trapping structure 801 has edges 805 and 806 which extend on either side of the active region 802. These edges 805 and 806 exist at the bottom regions of the trapping structure 801. In other words, the trapping structures are separated from adjacent trapping structures at their bottom-most regions. The combination (Poly) of the thin conformal sacrificial top oxide (optional), non-conformal oxide deposition, dry or wet or a combination of wet and dry etch of non-conformal oxide and thin oxide is deposited on trapping layer on STI oxide while residual oxide remains on SD, and etching the trapping layer between core cells for isolations makes this new fabrication process self-aligned according to this embodiment of the present invention. For a 22 nm fabrication process, the separation between the trapping layers is approximately 10 nanometers wide. In contract to the upwardly extending wings of the charge trapping layer associated with some self-aligned processes, the present invention produces folded-down wings with minimal extensions on the sides. This new configuration is superior for purposes of scaling. In other words, the core cells can be placed closer together. Furthermore, the wider channel width enables the drain voltage to be reduced which mitigates the short channel effect for the same drive current.

Figure 9:
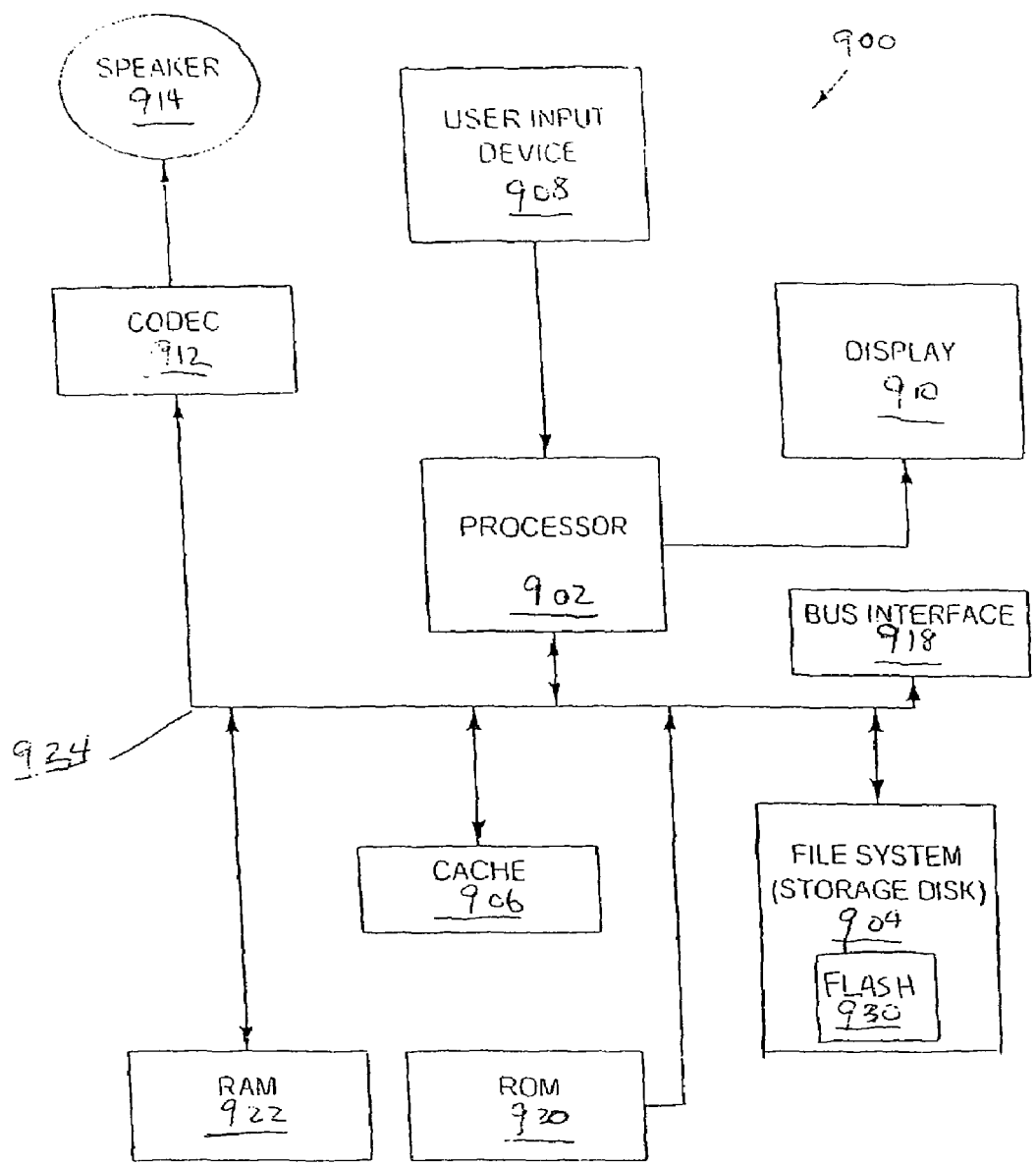
FIG. 9 shows a system according to embodiments of the present invention.

FIG. 9 shows a system according to embodiments of the present invention. The system 900 can be a portable multi-media device, media player, communications device, networking devices, computing device, consumer electronic device, mobile computing device, image capture device, audio/visual device, gaming console, etc. System 900 includes a process 902 that pertains to a microprocessor or controller for controlling the overall processing of data in system 900. Digital data is stored in a file system 904 and a cache memory 906. The file system 904 typically provides high capacity storage capability for system 900. File system 904 can include a non-volatile flash memory 930. Flash memory 930 has rounded STI corners and is manufactured as described above. The system 900 also includes volatile random access memory (RAM) 920 and non-volatile read-only memory (ROM) 922 for storing digital data. System 900 also includes a user input device 908, such as a button, keypad, dial, scroll wheel, touch sensitive pad, etc. A display 910 is used to display visual information to the user. A data bus 924 transfers data between the various components via a bus interface 918. A compression-decompression (CODEC) chip can be used to facilitate data storage and transfers. A speaker 914 is used to play back songs, voice messages, and other audio streams.

Therefore, a non-volatile, self-aligned semiconductor memory device optimized for scaling has been disclosed. In one embodiment, the STI process is performed before the ONO and polysilicon deposition steps. This enables the STI corners to be rounded after the STI process but before the ONO and polysilicon deposition steps. Moreover, the present invention is self-aligned. This is accomplished by means of a thin conformal sacrificial top oxide (optional), non-conformal oxide deposition, dry or wet etch of the non-conformal oxide, partially etching the trapping layer between the core cells and oxidizing the remaining trapping layer in top oxide for isolation. Scaling has been optimized by etching the trapping layer at the troughs rather than at the peaks. Although not shown, it should be appreciated that source and drain regions are formed in active regions of the substrate and that additional processing is performed to form a metallization system including contact structures.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a memory device, comprising:

performing a shallow trench isolation (STI) process on a semiconductor material to form a plurality of active regions and a plurality of isolation regions, the plurality of active regions being formed to comprise a plurality of exposed corners;

forming a plurality of charge trapping structures over the plurality of active, regions, wherein the plurality of charge trapping structures are self-aligned;

separating the plurality of charge trapping structures at their respective bottom portions such that the respective bottom portions of the plurality of charge trapping structures are separated by a distance that is greater than the distance separating respective top portions of the plurality of charge trapping structures;

forming a first layer of semiconductor or conductive material over the plurality of charge trapping structures, wherein the shallow trench isolation process is performed before the plurality of charge trapping structures is formed; and further wherein, a rounding process is performed on the plurality of exposed corners of the active region after the shallow trench isolation process is performed.

2. The method of claim 1, wherein the plurality of charge trapping structures is self-aligned by:

depositing a non-conformal oxide layer over a charge trapping layer, wherein the non-conformal oxide layer forms a pinch-off and void region over an STI trench;

opening up the pinch-off region by etch; and partially etching to separate the trapping structure layer between a plurality of cells for isolation in subsequent top oxide step.

3. The method of claim 2 further comprising:

forming a thin conformal sacrificial top oxide over the charge trapping layer before depositing the non-conformal oxide layer; and etching the thin sacrificial top oxide over the STI trench but leaving a thick residual oxide over the active region.

4. The method of claim 2 further comprising:

forming a top oxide on a portion of the charge trapping layer and converting the remaining portion of the trap layer to oxide to completely separate the trapping layer for each cell.

5. The method of claim 1, wherein forming a charge trapping structure comprises:

forming a bottom oxide layer over the active region;

forming a nitride layer over the first oxide layer; and forming a top block oxide layer over the nitride layer.

6. The method of claim 5, wherein the nitride layer is comprised of silicon rich nitride.

7. The method of claim 5, wherein the nitride layer is comprised of nitride on top of silicon rich nitride.

8. The method of claim 5, wherein the nitride layer is comprised of a plurality of layers of nitride, the plurality of layers comprising different percentages of silicon content.

9. The method of claim 1 further comprising:

fabricating a top oxide layer;

masking an ONO structure;

etching the ONO structure;

fabricating a first periphery gate oxide layer;

etching the periphery gate oxide layer; and fabricating a second periphery gate oxide layer, wherein the second periphery gate oxide layer is thinner than the first periphery gate oxide layer.

10. The method of claim 9 further comprising:

depositing polysilicon after the second periphery gate oxide layer;

defining word lines; and etching the top oxide layer and trapping layer between word lines.

11. A memory device, comprising:

a semiconductor substrate;

a plurality of active regions;

a plurality of corners comprised on the plurality of active regions;

a plurality of trenches separating the active regions; and a plurality of self-aligned charge trapping structures disposed over the plurality of active regions, wherein the charge trapping structures are separated at their respective bottom areas such that the respective bottom portions of the plurality of charge trapping structures are separated by a distance that is greater than the distance separating respective top portions of the plurality of charge trapping structures;

further wherein, a rounding process is performed on the plurality of corners comprised on the plurality of active regions before the plurality of self-aligned charge trapping structures are disposed over the plurality of active regions.

12. The memory device of claim 11, wherein the plurality of self-aligned charge trapping structures is formed through a process of depositing a non-conformal oxide layer over a charge trapping layer, wherein the non-conformal oxide layer forms a pinch-off region and a void over an STI trench, etching the pinch-off region, and etching to separate the trapping structure layer between a plurality of cells.

13. The memory device of claim 12, wherein a thin conformal sacrificial top oxide is formed over the charge trapping layer before depositing the non-conformal oxide layer.

14. The memory device of claim 11, wherein the charge trapping structures comprise an oxide-nitride-oxide structure.

15. The memory device of claim 14, wherein the nitride of the oxide-nitride-oxide structure is comprised of silicon rich nitride.

* * * * *